United States Patent
Lee

(10) Patent No.: US 8,922,299 B2
(45) Date of Patent: Dec. 30, 2014

(54) CIRCUIT FOR MITIGATING ELECTROMAGNETIC INTERFERENCE INPUT STAGE OF A DRIVER IC

(75) Inventor: Youngwuk Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 608 days.

(21) Appl. No.: 13/241,883

(22) Filed: Sep. 23, 2011

(65) Prior Publication Data

US 2012/0242424 A1    Sep. 27, 2012

(30) Foreign Application Priority Data

Mar. 24, 2011    (KR) .................. 10-2011-0026297

(51) Int. Cl.
*H03H 7/06* (2006.01)
*H03H 1/00* (2006.01)
*H03K 19/003* (2006.01)

(52) U.S. Cl.
CPC ....... *H03K 19/00346* (2013.01); *H03H 1/0007* (2013.01); *H03H 7/06* (2013.01)
USPC ............................................. 333/181; 333/12

(58) Field of Classification Search
CPC ......... H03H 1/0007; H03H 1/02; H03H 7/06; H03H 19/00346; H05B 33/0815; H02M 1/12; H02M 1/126
USPC ............ 333/12, 181; 363/47, 147; 315/209 R
See application file for complete search history.

(56) References Cited

U.S. PATENT DOCUMENTS

| | | | | |
|---|---|---|---|---|
| 5,751,115 A | * | 5/1998 | Jayaraman et al. | 315/225 |
| 6,242,990 B1 | * | 6/2001 | Sokolov | 332/103 |
| 6,313,616 B1 | * | 11/2001 | Deller et al. | 323/282 |
| 7,436,127 B2 | * | 10/2008 | Ribarich et al. | 315/291 |
| 8,648,547 B2 | * | 2/2014 | Akins | 315/294 |
| 2003/0210562 A1 | * | 11/2003 | Takehara et al. | 363/24 |

FOREIGN PATENT DOCUMENTS

| | | |
|---|---|---|
| CN | 2502485 Y | 7/2002 |
| CN | 2015-40530 U | 8/2004 |

OTHER PUBLICATIONS

Office Action dated Apr. 3, 2014 in Chinese Application No. 201210082481.6.

* cited by examiner

*Primary Examiner* — Benny Lee
*Assistant Examiner* — Rakesh Patel
(74) *Attorney, Agent, or Firm* — Saliwanchik, Lloyd & Eisenschenk

(57) ABSTRACT

The present disclosure relates to a circuit for mitigating EMI generated from an input terminal of an IC (Integrated Circuit) including a power input port connected to a first input and an operational mode selection port connected to a second input, the circuit including a first diode connected to the first input, an LC filter unit connectively interposed a cathode terminal of the first diode and the power input port, and a first resistor connectively interposed between the cathode terminal of the first diode and the second input.

7 Claims, 3 Drawing Sheets

FIG. 2b    (Prior Art)

CIRCUIT FOR MITIGATING ELECTROMAGNETIC INTERFERENCE INPUT STAGE OF A DRIVER IC

CROSS-REFERENCE TO RELATED APPLICATION

This application claims the benefit under 35 U.S.C. §119 of Korean Patent Application No. 10-2011-0026297, filed Mar. 24, 2011, which is hereby incorporated by reference in its entirety.

BACKGROUND OF THE DISCLOSURE

1. Field of the Invention

Exemplary embodiments of the present disclosure may relate to a circuit for mitigating an EMI (Electro-Magnetic Interference) in an input stage of a driver IC, and more particularly to an EMI mitigating circuit applied to an input terminal of a driver IC (Integrated Chip) driving an actuator in a head lamp of a vehicle.

2. Background of the Invention

As used herein, the term EMI should be considered to refer generally to both electromagnetic interference and radio frequency interference (RFI) emissions, and the term "electromagnetic" should be considered to refer generally to electromagnetic and radio frequency.

During normal operation, electronic equipment typically generates undesirable electromagnetic energy that can interfere with the operation of proximately located electronic equipment due to EMI transmission by radiation and conduction. The electromagnetic energy can exist over a wide range of wavelengths and frequencies. To minimize problems associated with EMI, sources of undesirable electromagnetic energy can be shielded and electrically grounded to reduce emissions into the surrounding environment. Alternatively, or additionally, susceptors of EMI can be similarly shielded and electrically grounded to protect them from EMI within the surrounding environment. Accordingly, shielding is designed to inhibit both ingress and egress of electromagnetic energy relative to a barrier, a housing, or other enclosure in which the electronic equipment is disposed.

EMI (Electro-Magnetic Interference) is regarded as a chronic noise problem as an operational frequency in electronic products increases. Particularly, the EMI problem has become more serious and a solution to address the EMI problem has become a pressing urgent necessity as the operational frequency in electronic products has expanded to several hundreds of MHz to several thousands of GHz.

The EMI noise is a noise causing generation of mutual interference when electromagnetic wave generated by any one of an electrical circuitry, an element and/or a part is transmitted to another electrical circuitry, element and/or part.

Unlike the conventional vehicles, the current vehicles are applied with electronic devices for convenience and safety, and manufactured with many electronic parts. Particularly, an adaptive head lamp system controlling movement of a head lamp of a vehicle is equipped with many electronic parts.

The EMI is largely generated by electrical/electronic signals generated for controlling movement of the head lamp. As noted above, during normal operation, electronic equipment typically generates undesirable EMI that can interfere with operation of proximately located electronic equipment due to EMI transmission by radiation and conduction that can cause erroneous operation to the disadvantage and safety problem to a driver and passengers.

Accordingly, it would be desirable and necessary to remove or mitigate the EMI in the electronic devices that causes potential danger.

SUMMARY

The present disclosure is disclosed to solve the abovementioned problems and disadvantages and the present disclosure is configured to solve the aforementioned disadvantages by providing a new circuit to an input terminal of an IC including a power input port of a driver IC including for driving a head lamp and an operational mode selection port.

Technical subjects to be solved by the present disclosure are not restricted to the above-mentioned description, and any other technical problems not mentioned so far will be clearly appreciated from the following description by the skilled in the art. That is, the present disclosure will be understood more easily and other objects, characteristics, details and advantages thereof will become more apparent in the course of the following explanatory description, which is given, without intending to imply any limitation of the disclosure, with reference to the attached drawings.

In one broad general aspect of the present disclosure, there is provided a circuit for mitigating EMI generated from an input terminal of an IC (Integrated Circuit) including a power input port connected to a first input and an operational mode selection port connected to a second input, the circuit comprising: a first diode connected to the first input; an LC filter unit connectively interposed a cathode terminal of the first diode and the power input port; and a first resistor connectively interposed between the cathode terminal of the first diode and the second input.

Preferably, the first resistor is a pull-up resistor absorbing the EMI generated from the input terminal of the IC.

Preferably, a power for driving the IC is inputted into the first input and a signal for operation mode selection of the IC is inputted into the second input Preferably, the LC filter unit includes an inductor connectively interposed between the cathode terminal of the first diode and the power input port, and a capacitor connectively interposed between the power input port and a ground, wherein an inductance value of the inductor is 2.2 µH, and a capacitance value of the capacitor is 220 µF.

Preferably, a resistance value of the first resistor is 1 kΩ.

Preferably, the circuit further comprises a second resistor connectively interposed between the second input and the operation mode selection port.

Preferably, the operation mode selection port and the first input are connected through the first and second resistors when the second input is opened.

The circuit for mitigating EMI in input stage of a driver IC according to an exemplary embodiment of the present disclosure has an advantageous effect in that EMI noise at a low band of an input terminal of IC of head lamp can be removed to inhibit erroneous operation and to secure stability.

BRIEF DESCRIPTION OF THE DRAWINGS

Accompanying drawings are included to provide a further understanding of arrangements and embodiments of the present disclosure and are incorporated in and constitute a part of this application. Now, non-limiting and non-exhaustive exemplary embodiments of the disclosure are described with reference to the following drawings, in which:

FIG. 2b is a schematic view illustrating an EMI generated by an input terminal of a driver IC according to prior art;

Figure 1:
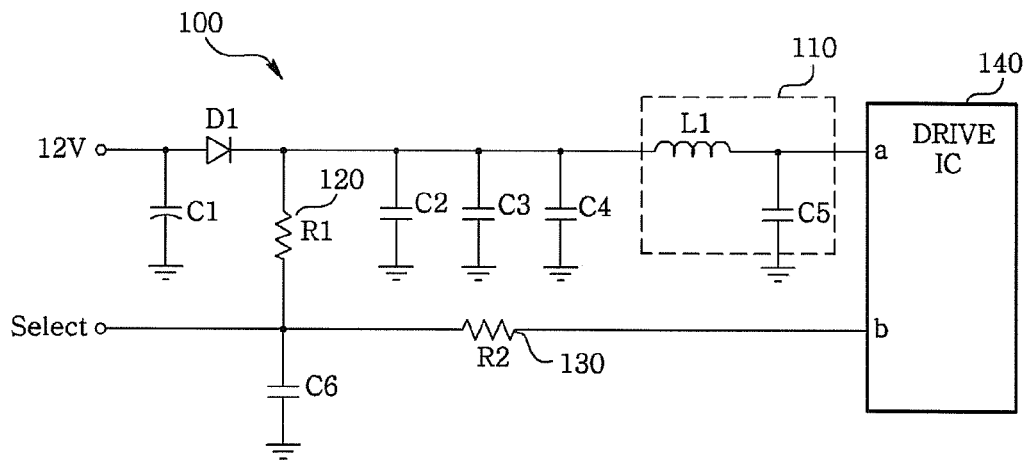
FIG. 1 is a schematic view illustrating an input terminal of a driver IC according to an exemplary embodiment of the present disclosure.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the method particularly pointed out in the written description and claims hereof as well as the appended drawings.

DETAILED DESCRIPTION

Hereinafter, exemplary embodiments of the present disclosure are described in detail with reference to the accompanying drawings. It will be appreciated that for simplicity and/or clarity of illustration, elements illustrated in the figure have not necessarily been drawn to scale. For example, the dimensions of some of the elements may be exaggerated relative to other elements for clarity. Further, if considered appropriate, reference numerals have been repeated among the figures to indicate corresponding and/or analogous elements.

Particular terms may be defined to describe the disclosure in the best mode as known by the inventors. Accordingly, the meaning of specific terms or words used in the specification and the claims should not be limited to the literal or commonly employed sense, but should be construed in accordance with the spirit and scope of the disclosure. The definitions of these terms therefore may be determined based on the contents throughout the specification.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

The term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In the following description and/or claims, the terms "comprise" and "include," along with their derivatives, may be used and are intended as synonyms for each other. Furthermore, the terms "including", "includes", "having", "has", "with", or variants thereof are used in the detailed description and/or the claims to denote non-exhaustive inclusion in a manner similar to the term "comprising".

Words such as "thereafter," "then," "next," etc. are not intended to limit the order of the processes; these words are simply used to guide the reader through the description of the methods. The terms "first," "second," and the like, herein do not denote any order, quantity, or importance, but rather are used to distinguish one element from another, and the terms "a" and "an" herein do not denote a limitation of quantity, but rather denote the presence of at least one of the referenced item.

In describing the present disclosure, detailed descriptions of constructions or processes known in the art may be omitted to avoid obscuring appreciation of the invention by a person of ordinary skill in the art with unnecessary detail regarding such known constructions and functions.

Now, a circuit for mitigating EMI generated from an input terminal of an IC (Integrated Circuit) will be described in detail with reference to the accompanying drawings.

FIG. 1 is a schematic view illustrating an input terminal of a driver IC according to an exemplary embodiment of the present disclosure.

The circuit (100) for mitigating EMI generated from an input terminal (hereinafter referred to as EMI mitigating circuit) includes a driver IC (140), an LC (Inductance-Capacitance) filter unit (110), a first capacitor (C1) connectively interposed between an outside power source (12V) for the driver IC (140) and a ground, a first diode (D1) serially connected to the outside power source (12V) and the LC filter unit (110), a plurality of second to fourth capacitors (C2, C3, C4) connectively interposed between a cathode terminal of the first diode (D1) and the ground, first and second resistors (120, 130) for absorbing EMI noise.

The LC filter unit (110) may include an inductance (L1) connectively interposed between a power input port (a) of driver IC and a cathode terminal of the first diode (D1), and a fifth capacitor (C5) connectively interposed between the power input port (a) and a ground.

A distal end of the first resistor (R1, 120) may be connected to the cathode terminal of the first diode (D1), and the other distal end of the first resistor (R1, 120) may be connected to an operation mode select input (SELECT). That is, the first resistor (R1, 120) is a pull-up resistor that pulls up the operation mode select input (SELECT) to a point (the cathode terminal of the first diode) where the power has passed the first diode (D1) to remove noise that is generated when the operation mode select input (SELECT) is opened.

Furthermore, a distal end of a second resistor (R2, 130) may be connected to the operation mode select input (SELECT), and the other distal end of the second resistor (R2, 130) may be connected to an operation mode select port (b) of the driver IC. The first resistor (R1, 120) is an element for absorbing an EMI noise generated by the IC input terminal.

Furthermore, a distal end of a sixth capacitor (C6) may be connected to the operation mode select input (SELECT), and the other distal end of the sixth capacitor (C6) may be connected to the ground.

The plurality of capacitors (C1 to C4) serves to perform a decoupling operation, whereby low frequency or high frequency components inputted from an outside power (12V) are charged or discharged and noise included in the outside power (12V) is removed. In a non-limiting example, the driver IC (140) may be AMIS30623.

The circuit for mitigating EMI of driver IC of a vehicular head lamp according to the exemplary embodiment of the present disclosure is a circuit for removing EMI generated from an input terminal of the IC including a power input port connected to a first input and an operation mode select port connected to a second input. Thus, the circuit may include a first diode connected to the first input, an LC filter unit connectively interposed a cathode terminal of the first diode and the power input port, and a first resistor connectively interposed between the cathode terminal of the first diode and the second input.

The first input may be a power (e.g., DC 12V) for driving the IC, and the second input may be an operation mode select input, that is, a signal for the operation mode selection (e.g., for selecting a left head lamp or a right head lamp). In other words, a power for driving the IC is inputted into the first input and a signal for operation mode selection of the IC is inputted into the second input.

The LC filter (110) may include an inductor (L1) connectively interposed between the cathode terminal of the first diode and the power input port (a), and a capacitor (C5) connectively interposed between the power input port (a) and a ground, where an inductance value of the inductor (L1) may be 2.2 μH, and a capacitance value of the capacitor (CS) may be 220 μF. Furthermore, the LC filter (110) may further include a second resistor connectively interposed between the second input and the operation mode select port (b), where each resistance value of the first resistor (120) and the second resistor (130) may be 1 kΩ.

In a non-limiting example, if the operation mode is a mode for controlling the left head lamp, the second input may be opened, where the operation mode select port (b) and the first input may be connected through the first resistor and the second resistor. In a non-limiting example, if the operation mode is a mode for controlling the right head lamp, the second input may be connected to the ground, where the operation mode select port (b) may be connected to the ground through the second resistor (130).

Figure 2A:
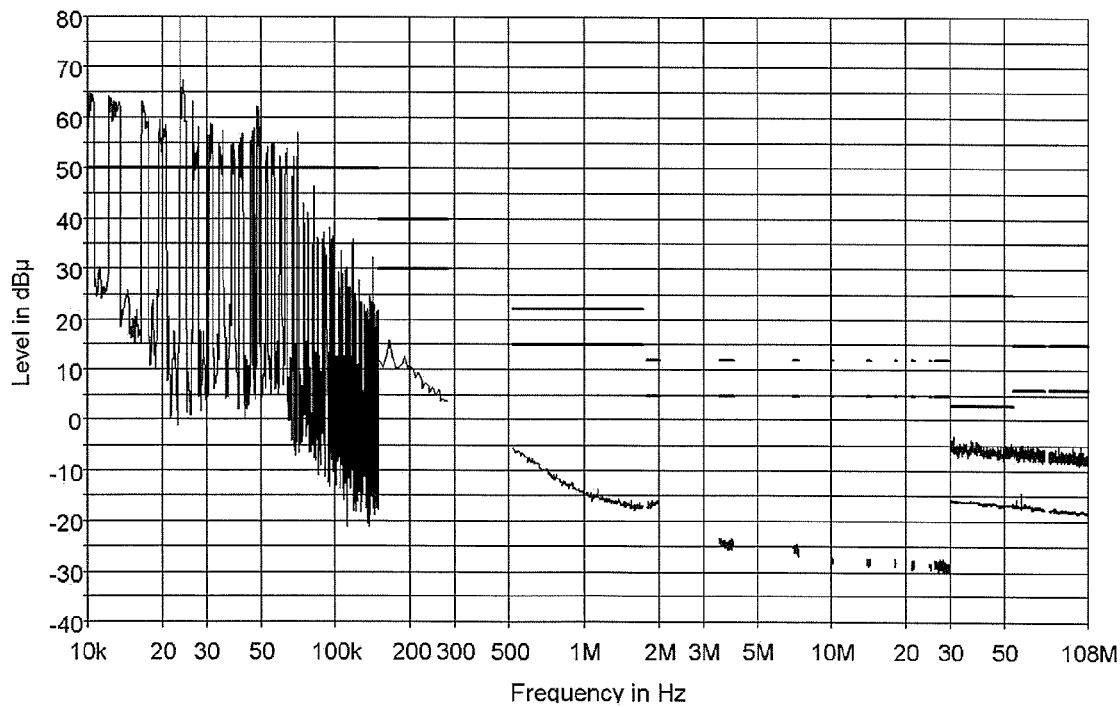
FIG. 2a is a schematic view illustrating an EMI generated by an input terminal of a driver IC according to prior art.

FIG. 2a is a schematic view illustrating an EMI generated by an input terminal of a driver IC according to prior art, and FIG. 2b is a schematic view illustrating an EMI generated by an input terminal of a driver IC according to prior art.

Referring to FIGS. 2a and 2b, the EMI noise was measured in 10 kHz~108 MHz, and the EMI noise in FIG. 2a was measured from a discrete distance of 5 cm, while the EMI noise in FIG. 2b was measured from a discrete distance of 75 cm. It can be noted that measurements of both FIGS. 2a and 2b have passed 50 dBμ at low frequency band (10 kHz~50 kHz), where 50 dBμ is a reference value which is a value specified in an exemplary application enabling to realize the driver IC for driving the head lamp of a vehicle. Therefore, the reference value may vary according to individual exemplary application.

In case of realizing a circuit according to the prior art, the above measured value has passed the reference value. In order to satisfy the reference value, the LC filter, the first resistor and the second resistor are added to the input terminal of the driver IC in the present disclosure.

Figure 3A:
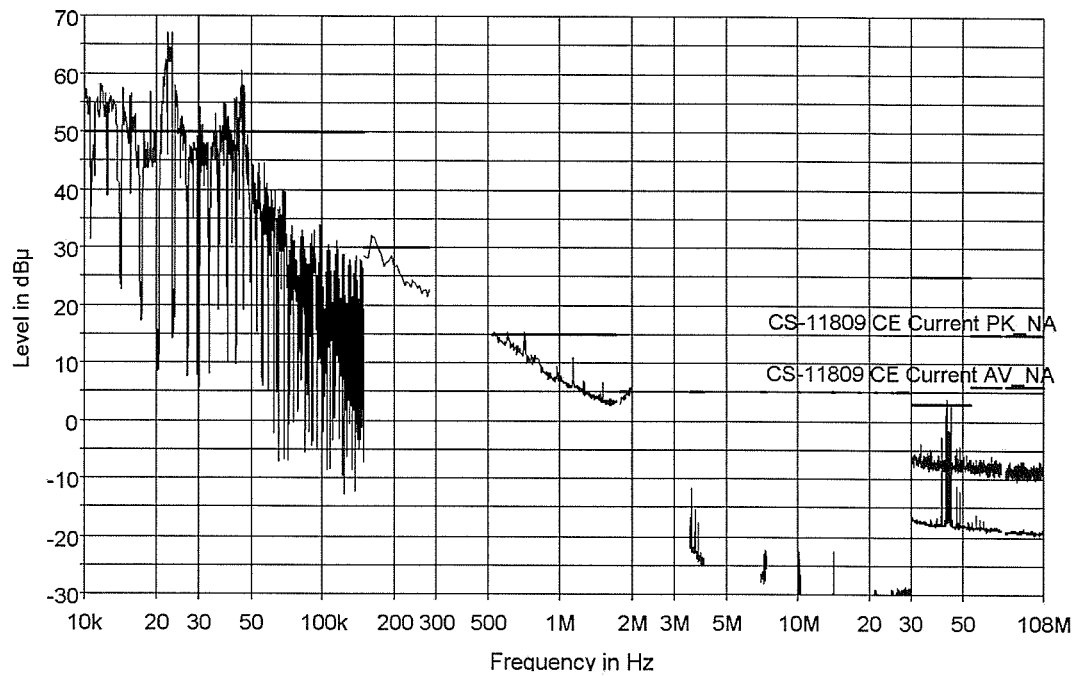
FIG. 3a is a schematic view illustrating an EMI generated by an input terminal of a driver IC according to an exemplary embodiment of the present disclosure.
Figure 3A:
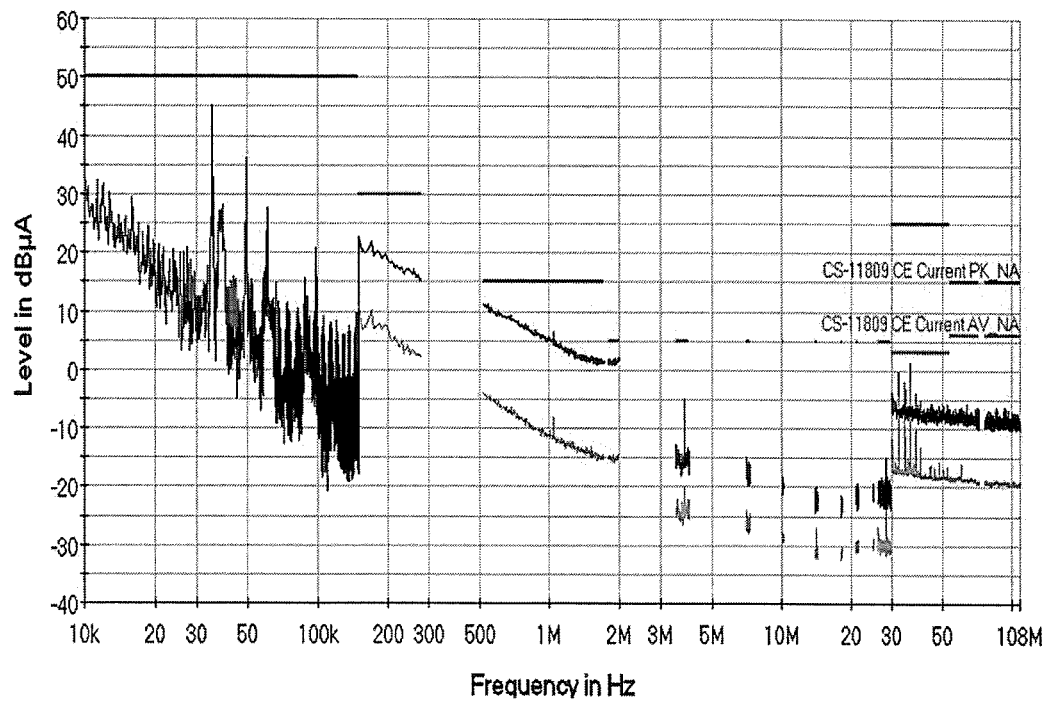
Figure 3B:
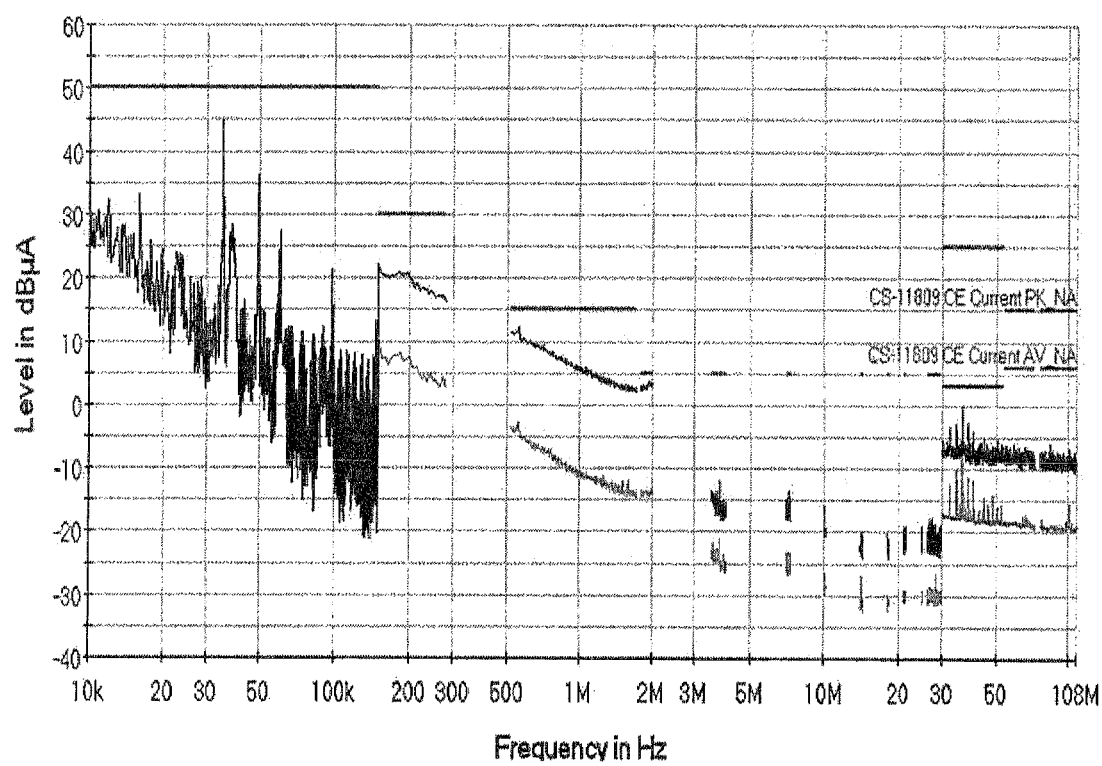
FIG. 3b is a schematic view illustrating an EMI generated by an input terminal of a driver IC according to an exemplary embodiment of the present disclosure.

FIG. 3a is a schematic view illustrating an EMI generated by an input terminal of a driver IC according to an exemplary embodiment of the present disclosure, and FIG. 3b is a schematic view illustrating an EMI generated by an input terminal of a driver IC according to an exemplary embodiment of the present disclosure, where an EMI noise generated from the input terminal was measured respectively.

Referring to FIGS. 3a and 3b, the EMI noise was measured in 10 kHz~108 MHz, and the EMI noise in FIG. 3a was measured from a discrete distance of 5 cm, while the EMI noise in FIG. 3b was measured from a discrete distance of 75 cm. It can be noted from FIGS. 3a and 3b that measurement result according to the exemplary embodiment of the present disclosure was below the reference value at low frequency band (10 kHz~50 kHz), and the EMI noise has greatly reduced at an approximate range of 10 kHz~150 kHz.

As apparent from the foregoing, the EMI mitigating circuit according to the exemplary embodiment of the present disclosure advantageously removes an EMI noise at low frequency band to inhibit an erroneous operation of driver IC, whereby a driver and a passenger can be protected against a potential danger that may be generated by the erroneous operation.

While particular features or aspects may have been disclosed with respect to several embodiments, such features or aspects may be selectively combined with one or more other features and/or aspects of other embodiments as may be desired.

What is claimed is:

1. A circuit for mitigating EMI generated from an input terminal of an Integrated Circuit(IC) including a power input port of the IC connected to a first input and an operational mode selection port of the IC connected to a second input, the circuit comprising:
    an LC filter connected to the power input port, the LC filter including a capacitor directly connected to the power input port and a ground, and an inductor directly connected to the power input port;
    a diode having an anode terminal directly connected to the first input and a cathode terminal directly connected to the inductor of the LC filter; and
    a first resistor connectively interposed between the cathode terminal of the diode and the second input.

2. The circuit of claim 1, wherein the first resistor is a pull-up resistor absorbing the EMI generated from the input terminal of the IC.

3. The circuit of claim 1, wherein a power for driving the IC is inputted into the first input and a signal for operation mode selection of the IC is inputted into the second input.

4. The circuit of claim 1, wherein an inductance value of the inductor is 2.2 μH, and a capacitance value of the capacitor is 220 μF.

5. The circuit of claim 1, wherein a resistance value of the first resistor is 1 kΩ.

6. The circuit of claim 1, wherein the circuit further comprises a second resistor connectively interposed between the second input and the operational mode selection port.

7. The circuit of claim 6, wherein the operational mode selection port and the first input are connected through the first and second resistors when the second input is opened.

* * * * *